United States Patent [19]

Cullum et al.

[11] Patent Number: 4,737,644
[45] Date of Patent: Apr. 12, 1988

[54] CONDUCTIVE COATED SEMICONDUCTOR ELECTROSTATIC DEFLECTION PLATES

[75] Inventors: Douglas G. Cullum; George J. Giuffre, both of Wappingers Falls; Timothy R. Groves, Poughkeepsie, all of N.Y.; Werner Stickel, Ridgefield, Conn.; Maris A. Sturans, Hopewell Junction, N.Y.

[73] Assignee: International Business Machines Corporation, Armonk, N.Y.

[21] Appl. No.: 793,046

[22] Filed: Oct. 30, 1985

[51] Int. Cl.⁴ .............................................. H01J 3/14
[52] U.S. Cl. .................................. 250/396 R; 250/398
[58] Field of Search ........... 250/396 ML, 396 R, 398, 250/400, 306, 307, 310; 313/421, 423

[56] References Cited

U.S. PATENT DOCUMENTS

| | | | |
|---|---|---|---|
| 4,047,184 | 9/1977 | Bassous et al. | 346/75 |
| 4,136,348 | 1/1979 | Damene | 357/15 |
| 4,309,460 | 1/1982 | Singh et al. | 427/250 |
| 4,310,569 | 1/1982 | Harrington | 427/89 |
| 4,338,612 | 7/1982 | Nagayama | 346/75 |
| 4,349,585 | 9/1982 | Nagashima et al. | 427/125 |
| 4,393,403 | 7/1983 | Geis et al. | 358/113 |
| 4,409,487 | 10/1983 | Kuschel et al. | 250/396 R |
| 4,494,004 | 1/1985 | Mauer, IV et al. | 250/492.2 |
| 4,661,709 | 4/1987 | Walker et al. | 250/492.2 |

FOREIGN PATENT DOCUMENTS 0050560 4/1980 Japan .
0207545 11/1984 Japan .
929909 6/1963 United Kingdom .
1039263 8/1966 United Kingdom .

OTHER PUBLICATIONS

Soviet Inventions Illustrated, SU-851 547, Section E1, week E 20, Jun. 30, 1982 (MOSC Eng-Phys. Inst.).

Primary Examiner—Carolyn E. Fields
Assistant Examiner—John A. Miller
Attorney, Agent, or Firm—Graham S. Jones, II; Douglas A. Lashmit

[57] ABSTRACT

An electrostatic deflection plate for charged particle beam systems is formed of a planar semiconductive substrate having a conductive region at the substrate surface. The conductive region is diffused or implanted into the body of the substrate, or one or more conductive layers are deposited upon the substrate surface. The substrate material is preferably silicon and the diffused or implanted region is formed of a nonmagnetic, nonoxidizable metal such as gold or platinum. The deposited conductive region may be formed of a single layer of these or similar metals, one or more conductive underlayers with a nonmagnetic, nonoxidizable overlayer, a single or multilayer structure with a conductive oxide on the outermost layer, or a metallo-organic compound which forms a conductive layer during following heat treatment. The deflection plates are fabricated using conventional semiconductor processes and form durable structures which minimize eddy current effects.

12 Claims, 1 Drawing Sheet

CONDUCTIVE COATED SEMICONDUCTOR ELECTROSTATIC DEFLECTION PLATES

BACKGROUND OF THE INVENTION

The present invention relates generally to charged particle beam systems and more particularly to improved electrostatic deflection plates used to control of the position of the beam in such systems.

Charged particle beam systems such as cathode ray tubes, ion beam systems, electron beam systems, ink-jet printers, and the like employ magnetic and electrostatic deflection techniques to control the position of the beam. In many applications a combination of both techniques is used, for example, in the electron beam lithography system described in U.S. Pat. No. 4,494,004 to Mauer et al., entitled "Electron Beam System" and assigned to the assignee of the present invention. In this system magnetic deflection is used to move the beam from subfield to subfield through a relatively large deflection angle, while electrostatic deflection controls the movement of the beam within a subfield. The dual deflection system substantially decreases the pattern writing time without sacrificing accuracy and resolution.

The combination of electrostatic and magnetic deflection limits the choice of electrostatic deflection structures that may be employed. A solid metal plate can not be used in the presence of dynamic magnetic fields because eddy currents would be generated in the metal, which would adversely affect the deflection accuracy of the system. Induced eddy currents also present a problem in systems employing only electrostatic deflection when the switching speed of the deflection voltage is greater than about 10 MHz.

One method of reducing eddy currents is to construct the deflection plates from an insulating material which has a conductive coating, for example, plastic coated with a thin metal layer. It is important that the coating be continuous, flat, and free of defects in order to prevent unwanted deflection of the beam due to charging of exposed insulators by stray electrons. Known structures are difficult to fabricate and the coatings have exhibited blistering, cracks and chipping because of the difficulty in making the metal layer adhere to the insulating substrate. These defects, which are often microscopic in size and hard to detect, cause localized charge build-up and can result in early and frequent system failure. The thin conductive coatings are fragile and easily damaged during handling and cleaning, necessitating replacement of the deflection plates.

SUMMARY OF THE INVENTION

The present invention overcomes the shortcomings of prior electrostatic deflection plates by providing a more durable structure which minimizes eddy current effects and which is fabricated using conventional semiconductor processes.

The electrostatic deflection plates of the present invention are formed of a planar semiconductive substrate having a conductive region at the substrate surface. According to one aspect of the invention the conductive region is diffused or implanted into the body of the substrate. According to another aspect of the invention one or more conductive layers are deposited upon the substrate surface. The substrate material is preferably silicon and the diffused or implanted region is formed of a nonmagnetic, nonoxidizable metal such as gold or platinum. The deposited conductive region may be formed of a single layer of these or similar metals, one or more conductive underlayers with a nonmagnetic, nonoxidizable overlayer, a single or multilayer structure with a conductive oxide on the outermost layer, or a metallo-organic compound which forms a conductive layer during heat treatment.

BRIEF DESCRIPTION OF THE DRAWINGS

Other objects and many of the attendant advantages of the present invention will be better understood by reference to the following detailed description in conjunction with the accompanying drawings, wherein.

DETAILED DESCRIPTION OF THE PREFERRED EMBODIMENTS

Figure 1:
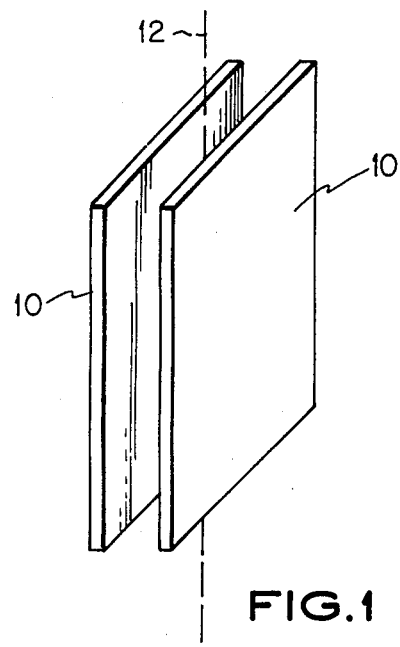
FIG. 1 is a diagrammatic view of a pair of electrostatic deflection plates according to the present invention for controlling a beam of charged particles.

Referring now to the drawings, there is shown in FIG. 1 a conventional arrangement of a pair of planar electrostatic deflection plates 10 for deflecting a beam 12 of charged particles, indicated by the dashed line. Beam 12 may be formed of electrons, ions, ink droplets as used in ink-jet printers, or other charged particles. A second pair of deflection plates (not shown) positioned orthogonal to the first pair is normally included in a conventional system.

Figure 2:
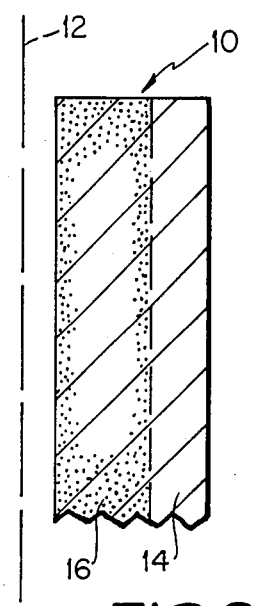
FIG. 2 is a greatly enlarged cross-sectional view of a portion of a deflection plate having a diffused or implanted conductive region according to one embodiment of the invention.

FIG. 2 shows an enlarged cross-sectional view of a portion of the surface of a deflection plate 10 exposed to the charged particle beam 12 according to one embodiment of the invention. Plate 10 is formed of a semiconductive substrate 14 having a conductive region 16 formed therein. It is important that the surface of the plate 10 exposed to beam 12 be continuous and smooth. Any defects or discontinuities in the conductor would cause a local charge build-up which would adversely affect the deflection accuracy of the system. The resistivity of substrate 14 is preferably in the range of about $10^{-2} - 10^{1}$ ohm-cm. Substrate 14 may advantageously be formed of a silicon wafer, either doped or undoped, having a thickness of about 10–30 mils as typically used in the fabrication of semiconductor integrated circuits. The surface of substrate 14 into which conductive region 16 is formed is lapped and polished by standard wafer manufacturing processes. The conductive material of region 16 must be nonmagnetic, nonoxidizable and capable of being diffused or implanted into silicon, for example, gold or platinum. Gold, for example, may be diffused by forming a layer on the surface of substrate 14 in a reducing atmosphere and then heating the structure at a temperature between about 600° C. to 1100° C. for a time sufficient to diffuse the gold to a depth of about 1 micron. Conventional ion implantation techniques may also be employed to form region 16.

Formed in this manner plate 10 is substantially impervious to abrasive cleaning.

Figure 3:
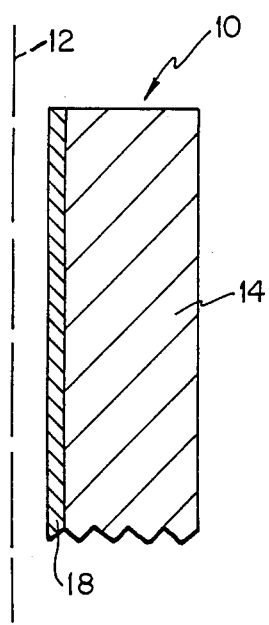
FIG. 3 is a cross-sectional view of a deflection plate having a deposited conductive layer according to another embodiment of the invention.

According to another embodiment of the invention, shown in FIG. 3, a conductive layer 18 is formed on silicon substrate 14, for example, by evaporative or sputter deposition or other known deposition techniques. A single layer, about 0.1-1.0 microns thick, of gold, platinum or other nonmagnetic, nonoxidizable metal may be used. Alternatively, one or more underlying conductive layers (not shown) may first be formed on the substrate 14 surface to promote adhesion of the final layer. For example, a chromium underlayer may be used with gold. Layer 18 can also be a metallo-organic compound which is applied to substrate 14 in liquid form to a thickness of about 10 microns. Plate 10 is then heated to about 400° C.-600° C. to oxidize and remove the organic material, leaving a metal layer 18 about 0.2 microns thick adhered to the substrate 14 surface. Such compounds containing, for example, gold are available from the Engelhard Corp.

Figure 4:
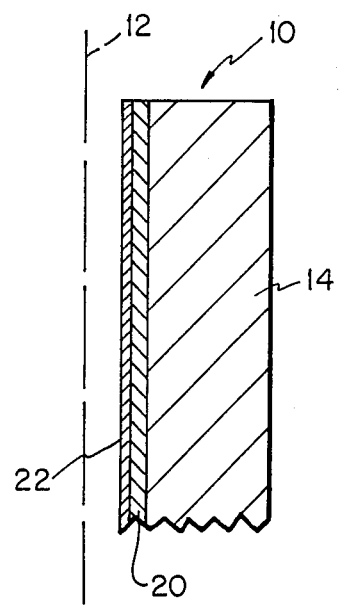
FIG. 4 is a cross-sectional view of another embodiment of the invention wherein a conductive oxide layer is formed on a conductive layer overlying the deflection plate.

Referring to FIG. 4, another embodiment is shown wherein a nonmagnetic metal layer 20 which forms a conductive oxide 22 is employed. One such metal is tin which forms conductive tin oxide. Another example is a conductive structure formed of indium-tin-oxide. The conductivity of the oxide layer is sufficient to prevent an adverse charge build-up on plate 10 which would affect the deflection of beam 12.

The deflection plates 10 may be held in place in a charged particle beam system by known means, for example, a support structure formed of ceramic with a metal coating. Plate 10 can be affixed to the support structure by an adhesive such as a conductive epoxy or a nonconductive epoxy coated with a conductive paint.

There has thus been provided by the present invention an improved electrostatic deflection deflection structure which is more durable than prior structures and can be readily fabricated using conventional semiconductor processing techniques.

While the invention has been particularly shown and described with reference to the preferred embodiments thereof, it will be understood by those skilled in the art that various changes in form and details may be made therein without departing from the spirit and scope of the invention.

What is claimed is:

1. An electrostatic deflection system for a beam of charged particles comprising:
   (a) an electrostatic deflection plate juxtaposed with said beam of charged particles,
   (b) said electrostatic deflection plate comprising a planar semiconductive member comprising a body of semiconductive material having a continuous conductive region formed at a surface thereof,
   (c) said conductive region covering at least the portion of said surface exposed to said beam of charged particles,
   (d) said conductive region comprising a conductive material diffused or implanted into said body of said semiconductor member.

2. The electrostatic deflection device of claim 1 wherein:
   said conductive region is formed of a nonmagnetic, nonoxidizable material.

3. The electrostatic deflection device of claim 3 wherein:
   said planar semiconductive member comprises silicon; and
   said conductive region comprises gold or platinum.

4. The electrostatic deflection device of claim 1 wherein said conductive region comprises:
   a layer of nonmagnetic, nonoxidizable material formed onto and extending outward from said surface of said planar semiconductive member.

5. The electrostatic deflection device of claim 4 wherein:
   said planar semiconductive member comprises silicon; and
   said conductive layer comprises gold or platinum.

6. The electrostatic deflection device of claim 4 wherein:
   said planar semiconductive member comprises silicon; and
   said conductive layer comprises a first metal layer overlying the surface of said silicon member and a second metal layer overlying said first metal layer.

7. The electrostatic deflection device of claim 6 wherein:
   said first metal layer comprises chromium and said second metal layer comprises gold.

8. The electrostatic deflection device of claim 4 wherein:
   said planar semiconductive member comprises silicon; and
   said conductive layer comprises a metallo-organic compound including gold, platinum or a combination thereof.

9. An electrostatic deflection system for a beam of charged particles comprising:
   (a) an electrostatic deflection plate having a first surface juxtaposed with and exposed to said beam of charge particles,
   (b) said electrostatic deflection plate comprising a planar substrate having a continuous conductive region formed in the surface thereof,
   (c) said conductive region covering at least the portion of said first surface exposed to said beam of charged particles,
   (d) said conductive region comprising a conductive material diffused or implanted into said body of said substrate.

10. An electrostatic deflection system for a beam of charged particles comprising:
    (a) an electrostatic deflection plate juxtaposed with said beam of charged particles,
    (b) said electrostatic deflection plate comprising a planar body of a semiconductive material with a portion thereof exposed to said beam of changed particles,
    (c) a continuous conductive layer formed onto and extending outwardly from a surface of said planar body of semiconductive material,
    (d) said conductive layer covering at least the portion of said surface exposed to said beam of charged particles; and
    (e) said conductive layer comprised of a material which forms a conductive oxide.

11. An electrostatic deflection system in accordance with claim 11 wherein
    (a) said planar semiconductive member comprises silicon; and
    (b) said material of said conductive layer comprises an oxide of tin.

12. An electrostatic deflection system in accordance with claim 11 wherein said oxide of tin comprises indium-tin-oxide.

* * * * *